United States Patent [19]
Shimada et al.

[11] Patent Number: 5,382,923
[45] Date of Patent: Jan. 17, 1995

[54] CHARGE-PUMP CIRCUIT FOR USE IN PHASE LOCKED LOOP

[75] Inventors: Toshizi Shimada; Yasunori Kanai, both of Nagano; Yoshio Watanabe, Kawasaki, all of Japan

[73] Assignees: Shinko Electric Industries Co., Ltd., Nagano; Fujitsu Limited, Kawasaki, both of Japan

[21] Appl. No.: 223,320

[22] Filed: Apr. 5, 1994

Related U.S. Application Data

[63] Continuation of Ser. No. 75,324, Jun. 11, 1993, abandoned.

[30] Foreign Application Priority Data

Jun. 12, 1992 [JP] Japan .................. 4-179222

[51] Int. Cl.⁶ ............... H03L 7/089; H03L 7/093
[52] U.S. Cl. ........................ 331/8; 331/17; 331/25; 327/157; 327/159
[58] Field of Search ........... 331/8, 17, 25; 328/133, 328/134, 155; 307/511, 516

[56] References Cited

U.S. PATENT DOCUMENTS 4,959,618  9/1990  Shier .................. 331/25 X

*Primary Examiner*—Siegfried H. Grimm
*Attorney, Agent, or Firm*—Staas & Halsey

[57] ABSTRACT

A charge-pump circuit for controlling a voltage controlled oscillator by converting a phase difference between two input signals, which never become low at the same time, into a voltage. The charge-pump circuit includes first and second feeder circuits, made of bipolar transistors, outputting current in accordance with the input signals; a capacitor circuit having first, second, and third capacitors, and the first and the second or the first and the third capacitors are charged by the output current from the first or the second feeder circuit; and a differential amplifying circuit amplifying the voltage between the ends of the first capacitor to a predetermined voltage for output. The differential amplifying circuit operates to draw the same leakage current from the second and the third capacitors when the first capacitor is not being charged. The charge-pump circuit is effectively used to control the frequency of the voltage controlled oscillator in an PLL circuit having a phase comparator, a voltage controlled oscillator, and an output circuit.

5 Claims, 14 Drawing Sheets

CHARGE-PUMP CIRCUIT FOR USE IN PHASE LOCKED LOOP

This application is a continuation of application Ser. No. 08/075,324, filed Jun. 11, 1993, now abandoned.

BACKGROUND OF THE INVENTION

1. Field of the invention

The present invention relates to a charge-pump circuit, especially the present invention relates to a charge-pump circuit used for a PLL (Phase Locked Loop) circuit.

2. Description of the Related Art

A charge-pump circuit functions to convert a phase difference between a first input signal and a second input signal into a voltage and transmits the converted voltage to another circuit. The charge-pump circuit is used, for example, to control the oscillating frequency of an internal oscillating circuit of a PLL circuit. That is, since the PLL circuit includes an internal oscillating circuit, and the oscillating frequency of the internal oscillating circuit is controlled by a charge on a capacitor provided therein, the charge-pump circuit is used to control the charge on the capacitor.

FIG. 1 shows one example of a conventional charge-pump circuit in a PLL circuit. The PLL circuit in this example generates a frequency from data bits transmitted at a known fundamental timing, and the generated frequency corresponds to the fundamental timing and is output therefrom. This PLL circuit includes a phase comparator 1, a charge-pump circuit 2 having a feeder circuit 3 and a loop filter 4, a VCO (Voltage Controlled Oscillator) 5, and a flip-flop (shown as D-F/F in FIG. 1). A capacitor which is not shown in FIG. 1 is provided in the loop filter 4.

In the PLL circuit as shown in FIG. 1, an input signal R1 and a frequency from VCO 5 are compared by the phase comparator 1, the resulting signals U1 and D1, after phase comparison, are input to the feeder circuit 3 of the charge-pump circuit 2 as a first drive signal and a second drive signal, and the capacitor in the loop filter 4 is charged in accordance with the difference of the phase between the input signal R1 and the oscillating frequency of VCO 5. Then the voltage across the capacitor is fed to the VCO 5, and the frequency of the VCO 5 is changed in accordance with the voltage level of the capacitor. The output signal from the VCO 5 is input to the flip-flop 6 as a clock signal, and the flip-flop 6 generates the data from the input signal R1 on the basis of the clock signal.

FIG. 2 shows a concrete conventional circuit diagram consisting of the phase comparator 1 and the charge-pump circuit 2 as shown in FIG. 1. The phase comparator 1 has a plurality of NAND circuits, and outputs pulse signals U1 and D1, having negative polarity, in accordance with the input signals R1 and V1. The negative pulses in the output signals U1 and D1 are not input to the charge-pump circuit 2 at the same time. Either one negative pulse, from either the output signal U1 or the output signal D1, is input to the charge-pump circuit 2, or no negative pulse is input to the charge-pump circuit 2. The charge-pump circuit 2 has the following elements: feeder circuit 3 comprised of bipolar transistors; MOS transistors TR2 and a bipolar transistor TR1 act as switching elements; and a loop filter 4 having a capacitor C which stores a voltage. There is a phase difference between the first drive signal U1 and the second drive signal D1, but both have a negative polarity and both are input to the charge-pump circuit 2 from the phase comparator 1.

FIGS. 3 to 6 are waveform diagrams showing input signals R1 and V1 input to the phase comparator 1; signals at points a, b, and c in the phase comparator 1; and output signals U1 and D1 to the charge-pump circuit 2.

FIG. 3 shows waveform diagrams at particular points a, b, and c in the phase comparator 1 and the charge-pump circuit 2 in FIG. 2 when the initial value of the point a is 0 and the point b is 0, and the phase of the input signal R1 lags compared to the phase of the input signal V1.

FIG. 4 shows waveform diagrams at particular points a, b, and c in the phase comparator 1 and the charge-pump circuit 2 in FIG. 2 when the initial value of the point a is 0 and the point b is 1, and the phase of the input signal R1 lags compared to the phase of the input signal V1.

FIG. 5 shows waveform diagrams at particular points a, b, and c in the phase comparator 1 and the charge-pump circuit 2 in FIG. 2 when the initial value of the point a is 1 and the point b is 0, and the phase of the input signal R1 lags compared to the phase of the input signal V1.

FIG. 6 shows waveform diagrams at particular points a, b, and c in the phase comparator 1 and the charge-pump circuit 2 in FIG. 2 when the initial value of the point a is 1 and the point b is 1, and the phase of the input signal R1 lags compared to the phase of the input signal V1.

As is understood from four waveform diagrams shown in FIGS. 3 to 6, a negative pulse having a width corresponding to the amount of phase lag appears, and the width of the second drive signal D1 equals the width of the negative pulse, when the phase of the input signal R1 lags compared to the phase of the input signal V1. Conversely, a negative pulse having a width corresponding to the amount of phase lead appears by the symmetry of the circuit as shown in FIG. 2, and the width of the first drive signal U1 equals the width of the negative pulse, when the phase of the input signal R1 leads compared to the phase of the input signal V1.

Next, the operation of the charge-pump circuit 2, to which the first and the second drive signals U1 and D1, as negative pulses, are input, is explained. First, when the first drive signal U1 changes from a high level to a low level at the input to the charge-pump circuit 2, the following operations occur: transistor TR3 turns ON; loop-filter 4 is activated; a current I1 flows to a capacitor C in the direction as shown by the arrow; the capacitor C is charged in accordance with drive time by the first drive signal U1 (the time between the drive signal U1 changing from a high level to a low level and returning to a high level, that is, equal to the width of the negative pulse); and a voltage appears at the terminal of the capacitor C.

Next, when the second drive signal D1 changes from a high level to a low level at the input to the charge-pump circuit 2, the following operations occur: transistor TR5 turns ON; transistor TR4 turns ON; transistor TR1 in the loop-filter 4 is activated; transistor TR2 is activated after the transistor TR1 turns on; a current I2 flows to a capacitor C in the direction as shown by the arrow; the capacitor C is charged in accordance with driving time by the first drive signal D1 (the time between the drive signal D1 changing from a high level to a low level and returning to a high level, that is, equal to the width of the negative pulse); and a voltage appears at the terminal of the capacitor C.

As described above, the current flowing to the capacitor C is inverted at every input of the negative pulse included in the first drive signal U1 and the second drive signal D1, and the voltage is charged in the capacitor in accordance with the difference between the timing of the first drive signal U1 and the second drive signal D1. By the way, it is necessary to prevent leakage of the charge from the capacitor through the control terminal of the transistor TR1 which functions as a switching element, when neither the first drive signal U1 nor the second drive signal D1 are input to the charge-pump circuit 2. Accordingly, a MOS transistor, whose control terminal has a high input impedance, is used as the transistor TR1 in the conventional charge-pump circuit to prevent the leakage of the charge from the capacitor C.

However, the conventional charge-pump circuit has the following problems, such as a high number of elements are mounted on the printed circuit board, and the mounting density of the circuit elements on the printed circuit board is decreased. The reasons for these problems are as follows: a part A, surrounded by a dashed line in FIG. 2, is not formed as an IC (Integrated Circuit); circuit elements such as transistors, a capacitor, and resistors are mounted on an external printed circuit board; a charge-pump circuit is constructed by connecting these elements via a printed circuit;

As a countermeasure to this problem, an attempt has been made to decrease the area of the circuit elements by combining a MOS transistor TR1 with the other circuit elements and forming an IC, to decrease the number of circuit elements. One way to make an IC is to form every circuit element by MOS technology, and the other way is to form the IC by Bi-MOS technology.

The way to form every circuit element by MOS technology has the merit of decreasing the manufacturing cost, but it has the problem that it cannot realize a high-speed circuit. The way to form the IC by Bi-MOS technology has the merit of realizing a high-speed circuit, but it has the problem that the manufacturing cost thereof will increase since the process of making a capacitor and a resistor and the process of making a transistor are not the same.

SUMMARY OF THE INVENTION

The object of the present invention is to provide a high-speed charge-pump circuit at a reduced manufacturing cost when it is formed as an IC, in which every circuit element is formed by using a bipolar transistor manufacturing process.

According to one aspect of the present invention, there is provided a charge-pump circuit, manufactured by a bipolar transistor manufacturing process, which converts the phase difference between the first and the second drive signal into a voltage due to a charge on the first capacitor, comprising: a first feeder circuit including a bipolar transistor outputting a current when a first drive signal is received; a second feeder circuit including a bipolar transistor outputting a current when a second drive signal is received; a capacitor circuit to which a voltage is charged by an output current from the first or the second feeder circuit, having first, second, and third capacitors, the first and the second feeder circuit are connected to the both ends of the first capacitor respectively, the second capacitor is connected between one end of the first capacitor and the reference voltage, and the third capacitor is connected between the other end of the first capacitor and the reference voltage; and a differential amplifying circuit including a bipolar transistor outputting the voltage between the both ends of the first capacitor after amplifying to the predetermined voltage.

According to another aspect of the present invention, there is provided the following features: the first and the second feeder circuit have the same circuit structure; the first and the second drive signals are input to the differential amplifying circuit; transistors are connected to collectors of two transistors of the differential circuit respectively; a current mirror circuit is connected to the emitters of these transistors; and the capacitor circuit is charged when the output of one of the first or the second driving circuit becomes low level.

Further, according to the present invention, the differential amplifying circuit comprises an input part, a differential amplifying part, and a voltage output part. The input part has two transistors formed as emitter-followers and they are connected to both ends of the first capacitor through resistors having the same resistance. The differential amplifying part has a differential circuit, including transistors connected to the input part, and outputs a voltage between both ends of the first capacitor C1. The voltage output part amplifies a voltage from the differential amplifying circuit and then outputs the same. The differential amplifying circuit constructed above outputs the same leakage current from the second and the third capacitors when the capacitor is not being charged. As a result, the voltage between both ends of the capacitor C1 is not changed.

Further, the charge-pump circuit according to the present invention can be used for controlling the frequency of the voltage controlled oscillator by an output signal therefrom in a PLL circuit having a phase comparator, a voltage controlled oscillator, and an output circuit, and an input signal thereto is a signal indicating a phase difference at the phase comparator.

In this way, the invention realizes a reduction in the manufacturing cost of the IC, since the circuit elements, such as the capacitors, the resistors, and the transistors are all formed by a bipolar transistor manufacturing process.

As a result, the invention realizes a high speed charge-pump circuit, since the circuit elements, such as the capacitors, the resistors, and the transistors are all formed by a bipolar transistor manufacturing process.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENT

A preferred embodiment according to the present invention will be explained hereinafter with reference to the attached drawings.

Figure 1:
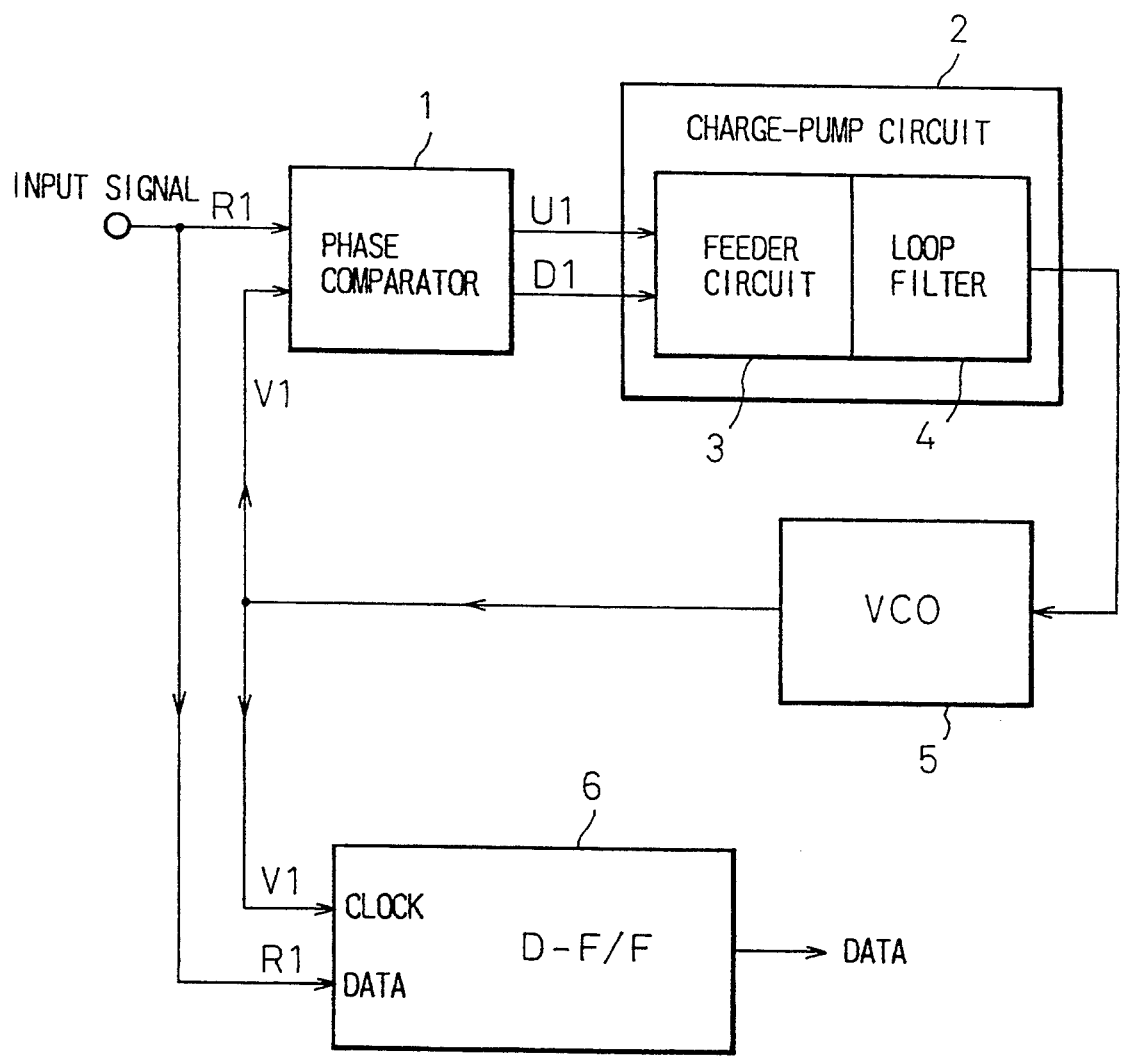
FIG. 1 is a block circuit diagram of a conventional PLL circuit using a charge-pump circuit.
Figure 2:
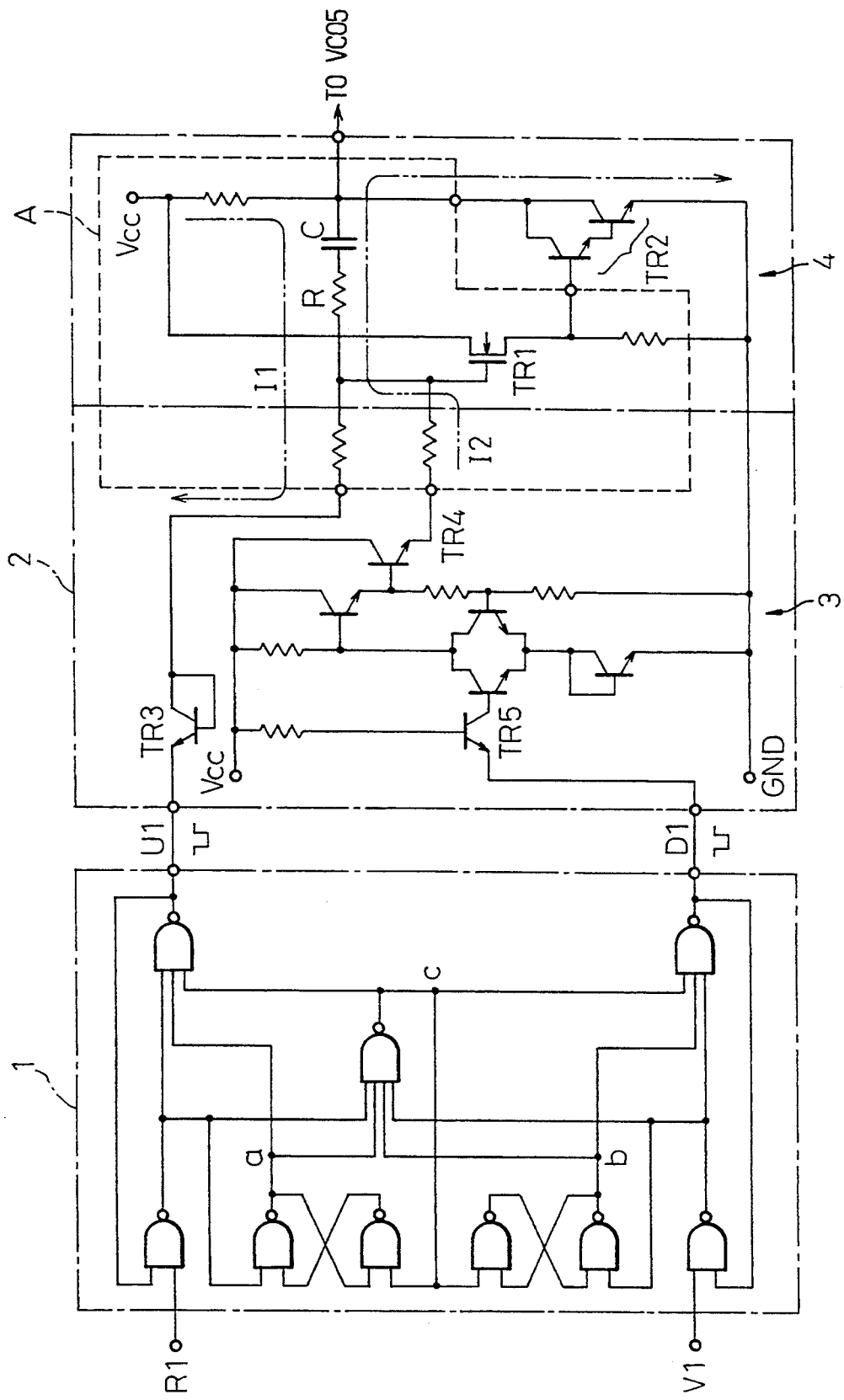
FIG. 2 is a conventional concrete circuit diagram showing a construction of a phase comparator and a charge-pump circuit as shown in FIG. 1.
Figure 3:
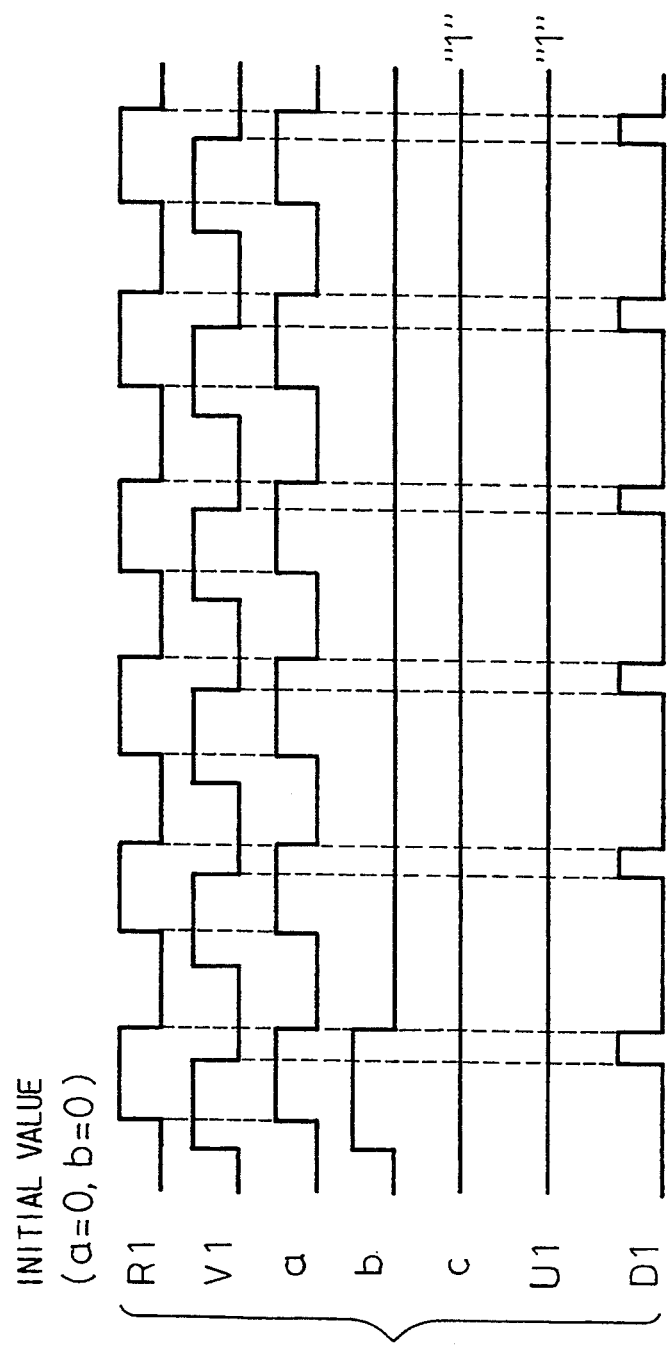
FIG. 3 shows waveform diagrams at particular points in the phase comparator and the charge-pump circuit in FIG. 2 when the initial value of a=0 and b=0, and the phase of the input signal R1 lags compared to the phase of the input signal V1.
Figure 4:
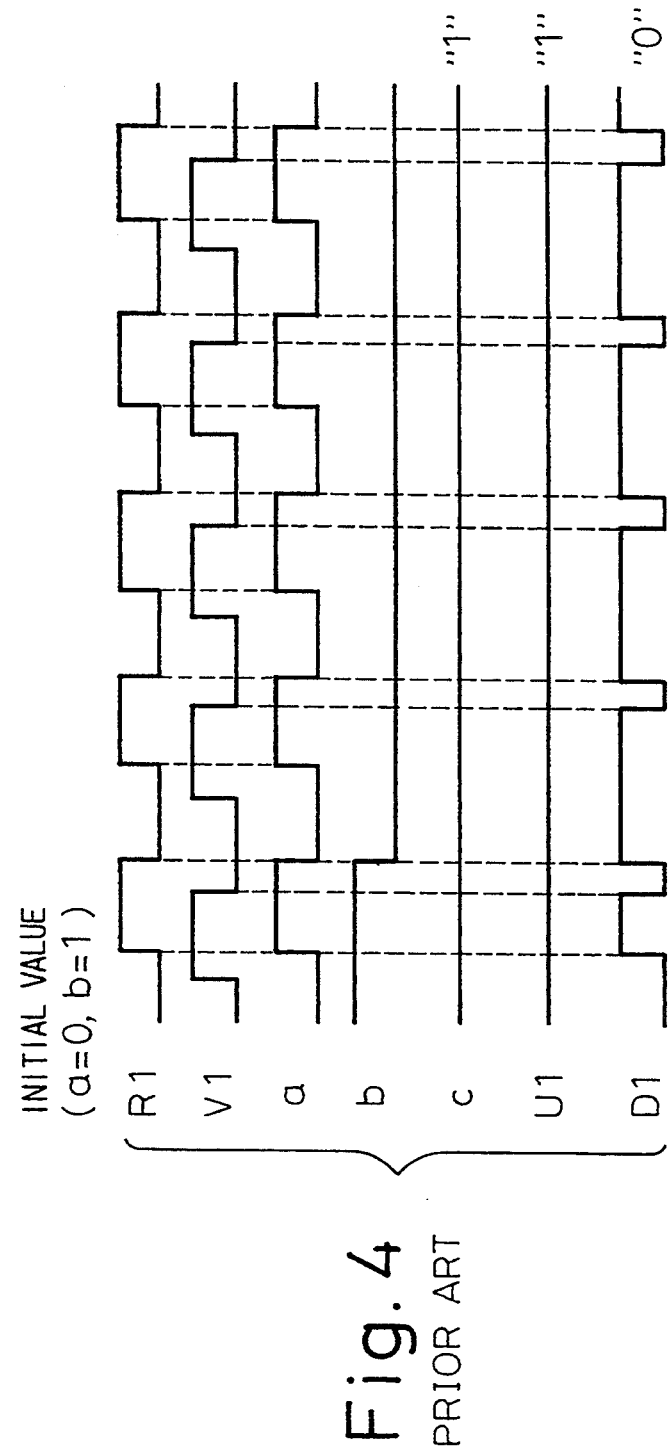
FIG. 4 shows waveform diagrams at particular points in the phase comparator and the charge-pump circuit in FIG. 2 when the initial value of a=0 and b=1, and the phase of the input signal R1 lags compared to the phase of the input signal V1.
Figure 5:
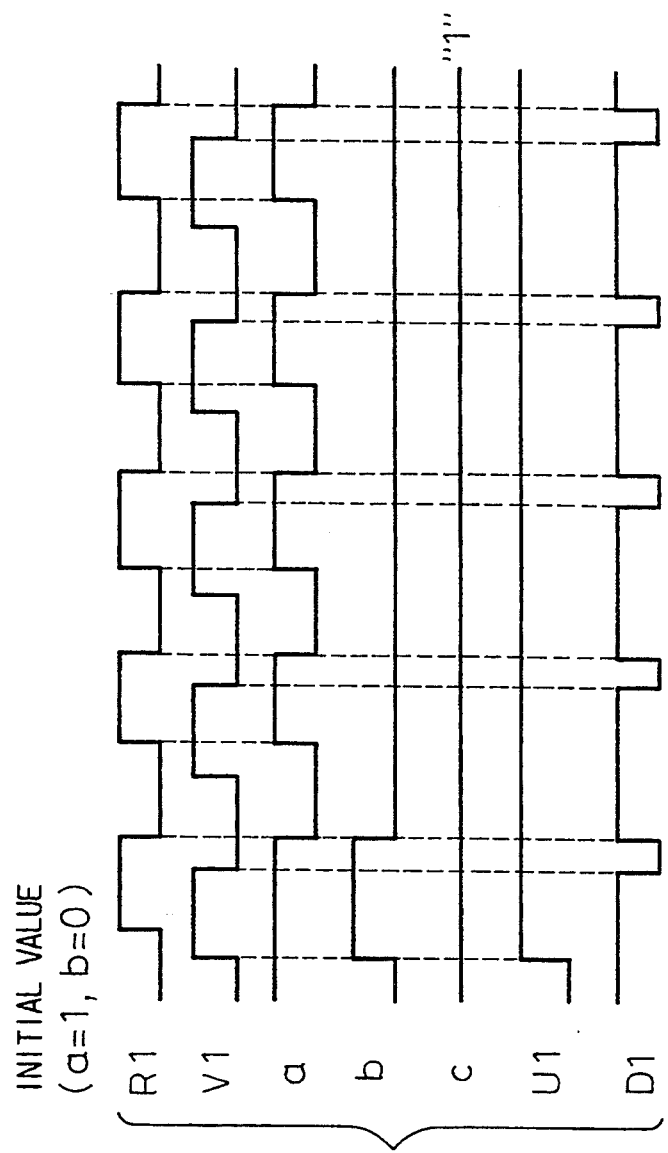
FIG. 5 shows waveform diagrams at particular points in the phase comparator and the charge-pump circuit in FIG. 2 when the initial value of a=1 and b=0, and the phase of the input signal R1 lags compared to the phase of the input signal V1.
Figure 6:
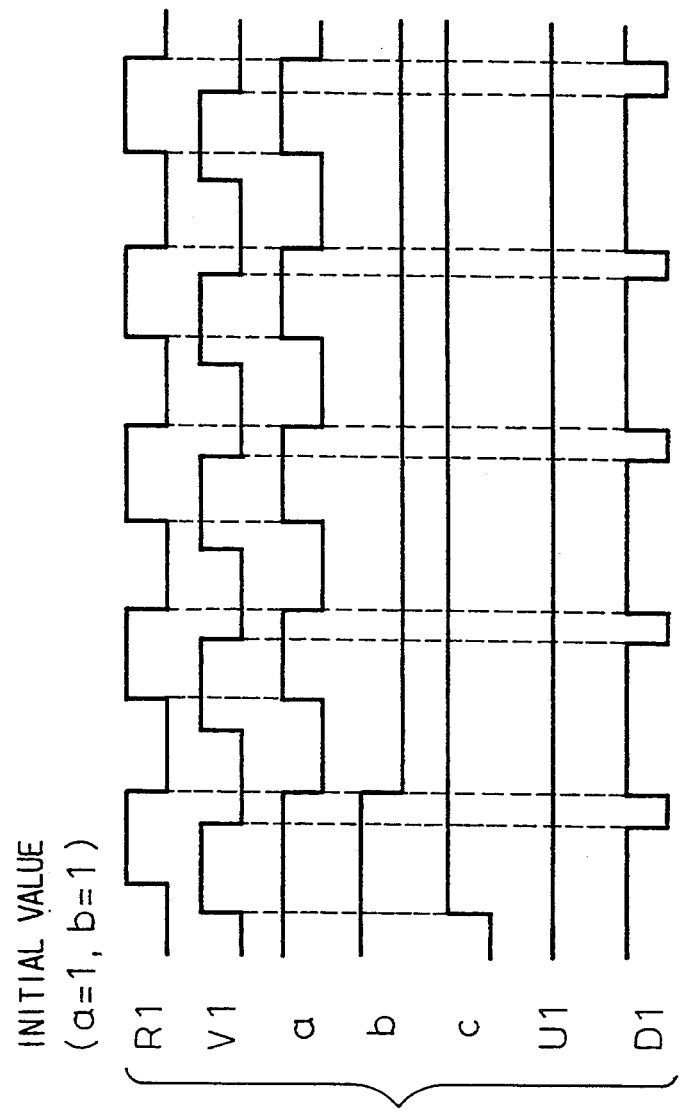
FIG. 6 shows waveform diagrams at particular points in the phase comparator and the charge-pump circuit in FIG. 2 when the initial value of a=1 and b=1, and the phase of the input signal R1 laggs compared to the phase of the input signal V1.
Figure 7:
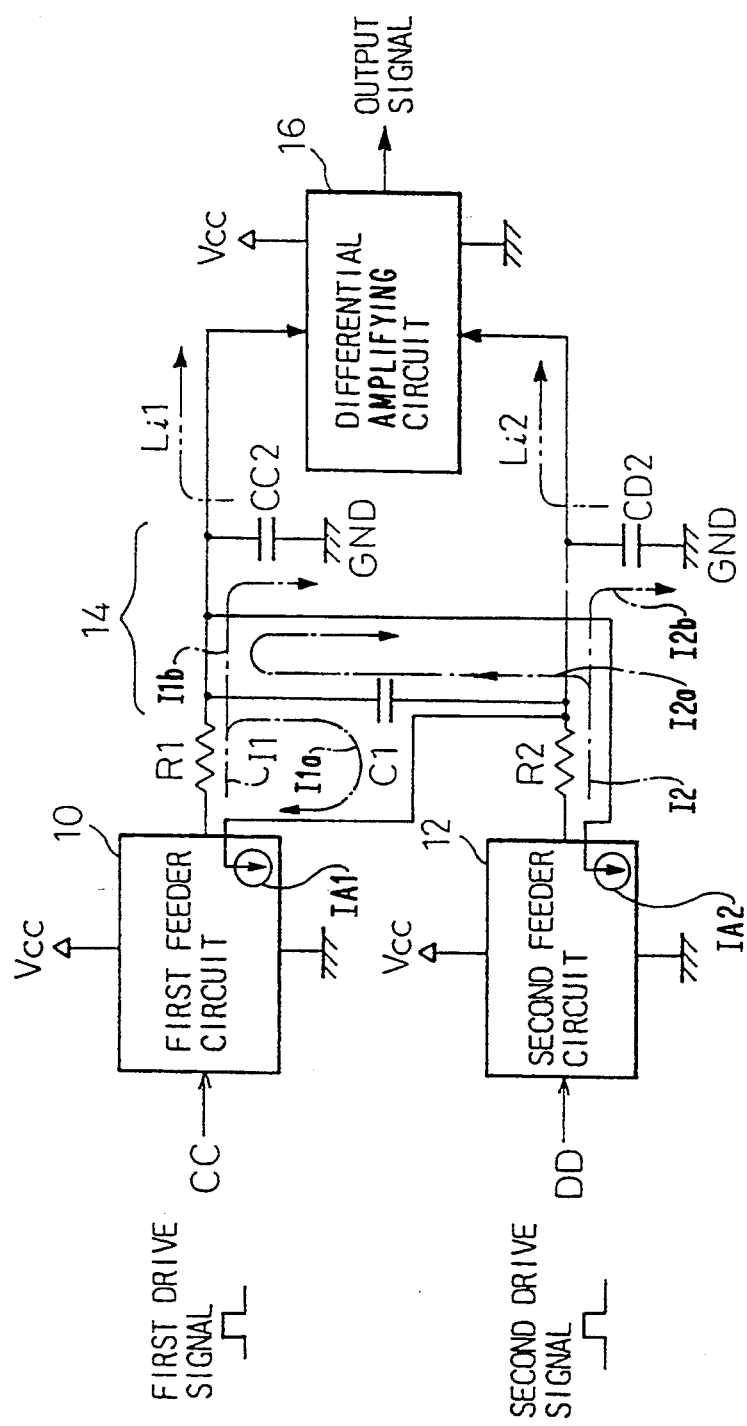
FIG. 7 is a block diagram showing a fundamental construction of the charge-pump circuit according to the present invention.

FIG. 7 is a block diagram showing a fundamental construction of the charge-pump circuit according to the present invention. The charge-pump circuit of the present invention converts the phase difference between the first drive signal CC and the second drive signal DD into a voltage, amplifies the voltage, and transmits it to the following circuit, and all of the circuit elements of the charge-pump circuit are manufactured by the bipolar transistor manufacturing process.

In FIG. 7, reference numeral 10 denotes a first feeder circuit including bipolar transistors and current source IA1; 12 denotes a second feeder circuit including bipolar transistors and current source IA2; 14 denotes a capacitor circuit including a first capacitor C1, a second capacitor CC2, and a third capacitor CD2; and 16 denotes a differential amplifying circuit including bipolar transistors. The first feeder circuit 10 outputs current I1 when the first drive signal CC is received. The second feeder circuit 12 outputs current I2 when the second drive signal DD is received. The differential amplifying circuit 16 amplifies the voltage between the both ends of the first capacitor C1 to the predetermined voltage and outputs the same.

The first feeder circuit 10 is connected to one end of the first capacitor C1 through a resistor R1, and the second feeder circuit 12 is connected to the other end of the first capacitor C1 through a resistor R2. The first capacitor C1 is charged by the current output from the first feeding circuit 10 or the second feeder circuit 12. The second capacitor CC2 is connected between one end of the first capacitor C1 and the reference voltage GND, and the third capacitor CD2 is connected between the other end of the first capacitor C1 and the reference voltage GND.

The first feeder circuit 10 includes a current source IA1, and the second feeder circuit 12 includes a current source IA2.

The current source IA1 operates as a current source when the first drive signal CC is at a high level and does not operate as a current source when the first drive signal CC is at a low level. Current source IA1 enters a high impedance state when the first drive signal CC is at a low level.

The current source IA2 operates as a current source when the second drive signal DD is at a high level and does not operate as a current source when the second drive signal DD is at a low level. Current source IA2 enters a high impedance state when the second drive signal DD is at a low level.

When the first drive signal CC is at a high level, current I1 output from the first feeder circuit 10 flows to the resistor R1 and then is bifurcated. A first bifurcated current I1a flows to capacitor C1 and to current source IA1. A second bifurcated current I1b flows to the capacitor CC2. In this manner, the capacitors C1 and CC2 are charged.

When the second drive signal DD is at a high level, current I2 output from the second feeder circuit 12 flows to the resistor R2 and then is bifurcated. A first bifurcated current I2a flows to capacitor C1 and the current source IA2. A second bifurcated current I2b flows to the capacitor CD2. In this manner, the capacitors C1 and CD2 are charged.

In summary, in the charge-pump circuit as constructed above, when the first drive signal CC becomes high level, current I1 is output from the first feeder circuit 10 through a resistor R1, and the first capacitor C1 and the second capacitor CC2 are charged by the current I1. On the other hand, when the second drive signal DD becomes high level, current I2 is output from the second feeder circuit 12 through a resistor R2, and the first capacitor C1 and the third capacitor CD2 are charged by the current I1. The capacitor C1 is charged by both I1 and I2. The voltage between both ends of the first capacitor C1 is amplified by the differential amplifying circuit 16, and is transmitted to the following circuit as an output signal from the differential amplifying circuit 16.

Contrary to this, when neither the first drive signal CC nor the second drive signal DD is input to the charge-pump circuit, leak currents Li1 and Li2 flow to the differential amplifying circuit 16. The leak currents Li1 and Li2 are fed from the capacitor circuit 14. The leak currents Li1 and Li2 are generated by equal discharges from the second capacitor CC2 and the third capacitor CD2, connected to both ends of the first capacitor C1 respectively, according to the present invention. As a result, a discharge from the first capacitor C1 is prevented, thereby the level of the output signal from the differential amplifying circuit 16 is not changed when either the first drive signal CC or the second drive signal DD is not input to the charge-pump circuit.

Figure 8:
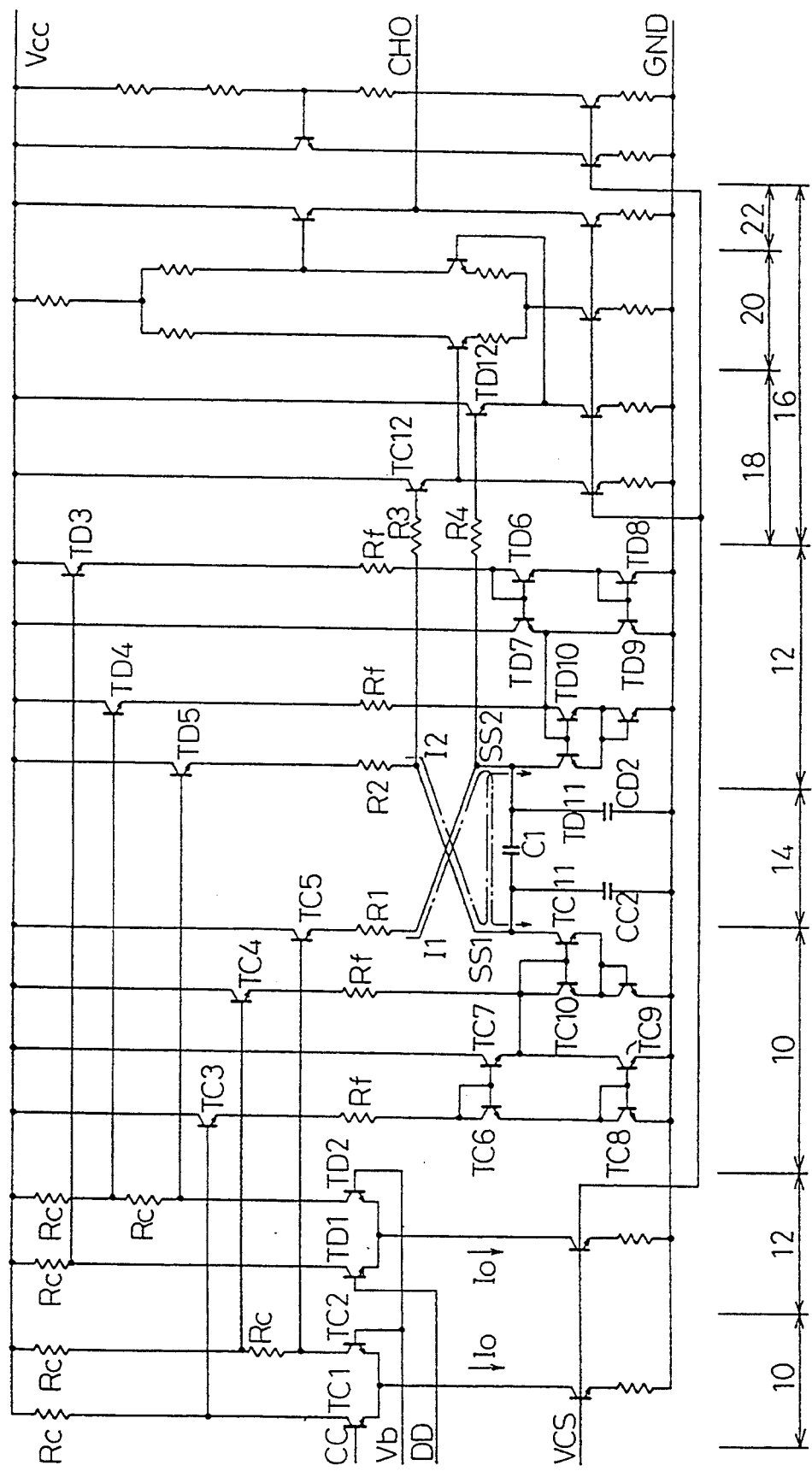
FIG. 8 is a concrete circuit diagram of the charge-pump circuit of FIG. 7 according to the present invention.

FIG. 8 is a concrete circuit diagram of the charge-pump circuit as shown in FIG. 7, and all of the circuit elements are formed by the bipolar transistor manufacturing process. The same reference numerals in FIG. 7 are assigned to the same parts in FIG. 8, and, accordingly, the reference numeral 10 denotes the first feeder circuit, 12 denotes the second feeder circuit, 14 denotes the capacitor circuit, and 16 denotes the differential amplifying circuit.

The first feeder circuit 10 is comprised of following elements: a differential circuit including transistors TC1 and TC2 wherein a total current Io flows; a transistor TC3 connected to a collector of the transistor TC1; transistors TC4 and TC5 connected to a collector of the transistor TC2; a current mirror circuit including transistors TC6 to TC9; and a current mirror circuit including transistors TC10 and TC11.

The second feeder circuit 12 is formed equivalent to the first feeder circuit 10, and is comprised of following elements: a differential circuit including transistors TD1 and TD2 wherein a total current Io flows; a transistor TD3 connected to a collector of the transistor TD1; transistors TD4 and TD5 connected to a collector of the transistor TD2; a current mirror circuit including transistors TD6 to TD9; and a current mirror circuit including transistors TD10 and TD11.

The capacitor circuit 14 is comprised of a first capacitor C1, a second capacitor CC2, and a third capacitor CD2. The second capacitor CC2 is connected between an input terminal SS1 provided at one end of the first capacitor C1 and a reference electrical potential GND. The third capacitor CD2 is connected between an input terminal SS2 provided at the other end of the first capacitor C1 and a reference electrical potential GND.

The connection between the capacitor circuit 14 and the first and the second feeder circuit 10 and 12 are as follows. As for the first feeder circuit 10, a collector of the transistor TC11 is connected to the input terminal SS1 of the capacitor circuit 14, and an emitter of the transistor TC5 is connected to the input terminal SS2 of the capacitor circuit 14 through a resistor R1. As a result, an integrating circuit is formed by the capacitor C1 and the resistor R1. Similarly, as for the second feeder circuit 12, a collector of the transistor TD11 is connected to the input terminal SS2 of the capacitor circuit 14, and an emitter of the transistor TD5 is connected to the input terminal SS1 of the capacitor circuit 14 through a resistor R2. In the same manner, a integrating circuit is formed by the capacitor C1 and the resistor R2.

The differential amplifying circuit 16 has an input part 18, a differential amplifier 20, and a voltage output part 22. The input part 18 includes transistors TC12 and TD12 formed as an emitter follower, and resistors R3 and R4. The resistor R3 is connected between a base of the transistor TC12 and the input terminal SS1 of the capacitor circuit 14. The resistor R4 is connected between a base of the transistor TD12 and the input terminal SS2 of the capacitor circuit 14. The high impedance input part 18 has a function of receiving a voltage at the input terminals SS1 and SS2 of the capacitor circuit 14 and of outputting the same to the differential amplifier 20 at a low impedance. The resistors R3 and R4 have the same resistance and the value thereof is large in order to prevent leakage of the charge stored in the capacitor circuit 14. The differential amplifier 20 is formed by using transistors, and it detects the voltage difference across the first capacitor C1 and outputs the same to the voltage output part 22. The voltage difference across the first capacitor C1 appears at the input terminals SS1 and SS2 of the capacitor circuit 14 in accordance with the output signal of the input part 18. The voltage output part 22 amplifies the detected voltage across the first capacitor C1 and outputs the same as a voltage CHO to the following circuit.

The charge-pump circuit having the above-described structure can output the difference between the driving times (equal to pulse widths) of the first drive signal CC and the second drive signal DD as the voltage CHO. The operation of the charge-pump circuit will be explained hereinafter.

First, the operation of the first feeder circuit 10 will be explained. Since the transistors TC1 and TC2 of the first feeder circuit 10 are formed to be a differential circuit whose total current is Io, the transistor TC1 turns ON and the transistor TC2 turns OFF when the first drive signal CC at a high level is input to the transistor TC1. Conversely, the transistor TC1 turns OFF and the transistor TC2 turns ON when the first drive signal CC at a low level is input to the transistor TC1.

After this, the current Ie3 flows through the transistor TC3 connected to the collector of the transistor TC1; current Ie4 flows through the transistor TC4 connected to the collector of the transistor TC2; and state of the transistor TC5 connected to the collector of the transistor TC2 follows the state of the first drive signal CC. Note, Vbe indicates a forward voltage between the base and the emitter of the transistor; Vcc indicates a source voltage; Rc indicates the value of the resistance of the resistor used in the differential circuit; and Rf indicates the value of the resistance of the resistor connected to the emitters of the transistors TC3 and TC4.

(1) When the first drive signal CC is at a high level:

At this time, the transistor TC5 is OFF, and the current Ie3 flowing through the transistor TC3 and the current Ie4 flowing through the transistor TC4 are expressed by following equations.

$$I_{e3} \rightleftharpoons (V_{cc} - R_c \cdot I_o - 3 \cdot V_{be}) \times 1/R_f$$

$$I_{e4} \rightleftharpoons (V_{cc} - 3 \cdot V_{be}) \times 1/R_f$$

(2) When the first drive signal CC is at a low level:

At this time, the transistor TC5 is ON state, and the current Ie3 flowing through the transistor TC3 and the current Ie4 flowing through the transistor TC4 are expressed by following equations.

$$I_{e3} \rightleftharpoons (V_{cc} - 3 \cdot V_{be}) \times 1/R_f$$

$$I_{e4} \rightleftharpoons (V_{cc} - R_c \cdot I_o - 3 \cdot V_{be}) \times 1/R_f$$

As is known from these equations, the current Ie4 flowing to the transistors TC9 and TC10 through the transistor TC4 becomes large when the current Ie3 flowing to the transistors TC6 and TC8 through the transistor TC3 is small. Conversely, the current Ie4 flowing to the transistors TC9 and TC10 through the transistor TC4 becomes small when the current Ie3 flowing to the transistors TC6 and TC8 through the transistor TC3 is large.

Note, when the first drive signal CC is at a low level and the second drive signal DD is at a high level: the base of the transistor TC3 is at a high level and turns on the transistor TC3; and the base of the transistors TC4 and TC5 are at a low level and to turn off the transistor TC4 and TC5, respectively. In this state, the transistor TC3 functions as an emitter-follower, and the current Ie3 flowing through the emitter of the transistor TC3 flows through the resistor Rf.

Since the transistors TC8 and TC9, and the transistors TC10 and TC11, are formed as a current mirror circuit, when the current Ie3 flows through the transistor TC10, the current Ie3 also flows through the transistor TC11. Accordingly, when Ie3>Ie4, almost all the current flowing through the transistor TC4 flows to the transistor TC9 and the transistor TC10 is OFF. At this time, the transistor TC11 is also OFF. Conversely, when Ie3<Ie4, almost all the current flowing through the transistor TC4 flows to the transistor TC10 and the transistor TC10 is ON. At this time, the transistor TC11 also turns ON.

Moreover, since the structure of the second feeder circuit 12 is the same as the first feeder circuit 10, when the second drive signal DD, at a high level, is input to the transistor TD1, the transistor TC5 turns ON and at the same time current flowing through the transistor TD4 becomes large and the transistor TD11 also turns ON. Conversely, when the second drive signal CC, at a low level, is input to the transistor TD1, the transistor TD1 turns OFF, and at the same time, current flowing through the transistor TD4 becomes small and the transistor TD11 also turns OFF.

The emitters of the transistors TC5 and TD5 are connected to the capacitor circuit 14 via the resistors R1 and R2 which form integrating circuits respectively. Accordingly, when the first drive signal CC of high level and the second drive signal DD of low level are input to the first and the second feeder circuits 10 and 12, respectively, the transistors TC5 and TC11 turn ON and the transistors TD5 and TD11 turn OFF. As a result, the current I1 flows to the capacitor circuit 14 via the resistor R1, and the capacitors C1, CC2 and CD2 are charged. When the second drive signal DD returns to high level, the transistors TC5 and TC11 turn OFF, and the charging operation of the capacitors C1, CC2 and CD2 is stopped. Conversely, when the first drive signal CC, at a low level, and the second drive signal DD, at a high level, are input to the first and the second feeder circuits 10 and 12, respectively, the transistors TC5 and TC11 turn OFF and the transistors TD5 and TD11 turn ON. As a result, a current I2 flows to the capacitor circuit 14 via the resistor R2, and the capacitors C1, CC2 and CD2 are charged. When the first drive signal CC returns to a high level, the transistors TD5 and TD11 turn OFF, and the charging operation of the capacitors C1, CC2 and CD2 is stopped. In this way, the amount of charge stored in the capacitor C1 is proportional to the difference in the driving times of the first drive signal CC and the second drive signal DD.

The input part 18 of the differential amplifying circuit 16 includes the transistors TC12 and TD12 formed as an emitter follower, and resistors R3 and R4. The resistor R3 is connected between a base of the transistor TC12 and the input terminal SS1 of the capacitor circuit 14. The resistor R4 is connected between a base of the transistor TD12 and the input terminal SS2 of the capacitor circuit 14. The input part 18 has a function of receiving a voltage at the high impedance input terminals SS1 and SS2 of the capacitor circuit 14, and of outputting the same to the differential amplifier 20 at a low impedance. The resistors R3 and R4 have the same resistance and the value thereof is large in order to prevent the leakage of the charge stored in the capacitor circuit 14.

The differential amplifier 20 is formed by using transistors and it detects the voltage difference across the first capacitor C1 and outputs the same to the voltage output part 22. The voltage difference across the first capacitor C1 appears at the input terminals SS1 and SS2 of the capacitor circuit 14 in accordance with the output signal of the input part 18. The voltage output part 22 amplifies the detected voltage level of the first capacitor C1 and outputs the same as a voltage CHO to the following circuit.

In the differential amplifying circuit 16, having the above-described action, a differential circuit is used and the pair of emitter follower circuits are connected as a preceeding circuit in order to detect the voltage difference between the ends of the first capacitor C1. Accordingly, the voltage of the input terminals SS1 and SS2 of the capacitor circuit 14 leaks under the condition that the charging operation of the first capacitor C1 is not carried out, that is, under the condition that the first drive signal CC at a high level and the second drive signal DD at a high level are input to the first and the second feeder circuit 10 and 12.

However, in the capacitor circuit 14 as shown in FIG. 8, the second capacitor CC2 and the third capacitor CD2 are provided at the ends of the first capacitor C1, respectively, to hold the voltage thereof. Moreover, the leakage current flowing in the base of the transistors TC12 and TD12 from the capacitors CC2 and CD2, respectively, are approximately the same since the resistances of the resistors R3 and R4 are the same. Further, since the amount of the leakage currents are constant regardless of the dc base voltage of the transistors TC12 and TD12, a voltage fluctuation across the ends of the capacitor C1 due to the base current of the transistors TC12 and TD12 is prevented. As a result, an accurate voltage detection across the first capacitor C1 can be realized, in spite of the voltage fluctuation of the input terminals SS1 and SS2 of the capacitor circuit 14.

As described above, the charge-pump circuit having the structure as shown in FIG. 8 can output the difference of the driving time (pulse width) between the first drive signal CC and the second drive signal DD as the voltage CHO. Moreover, since the charge-pump circuit in FIG. 8 can be formed using only bipolar transistors, it is easy to produce the charge-pump circuit as an IC. Further, as is known in FIG. 8, only NPN transistors are used in the charge-pump circuit, thereby realizing a high speed operation.

Figure 9:
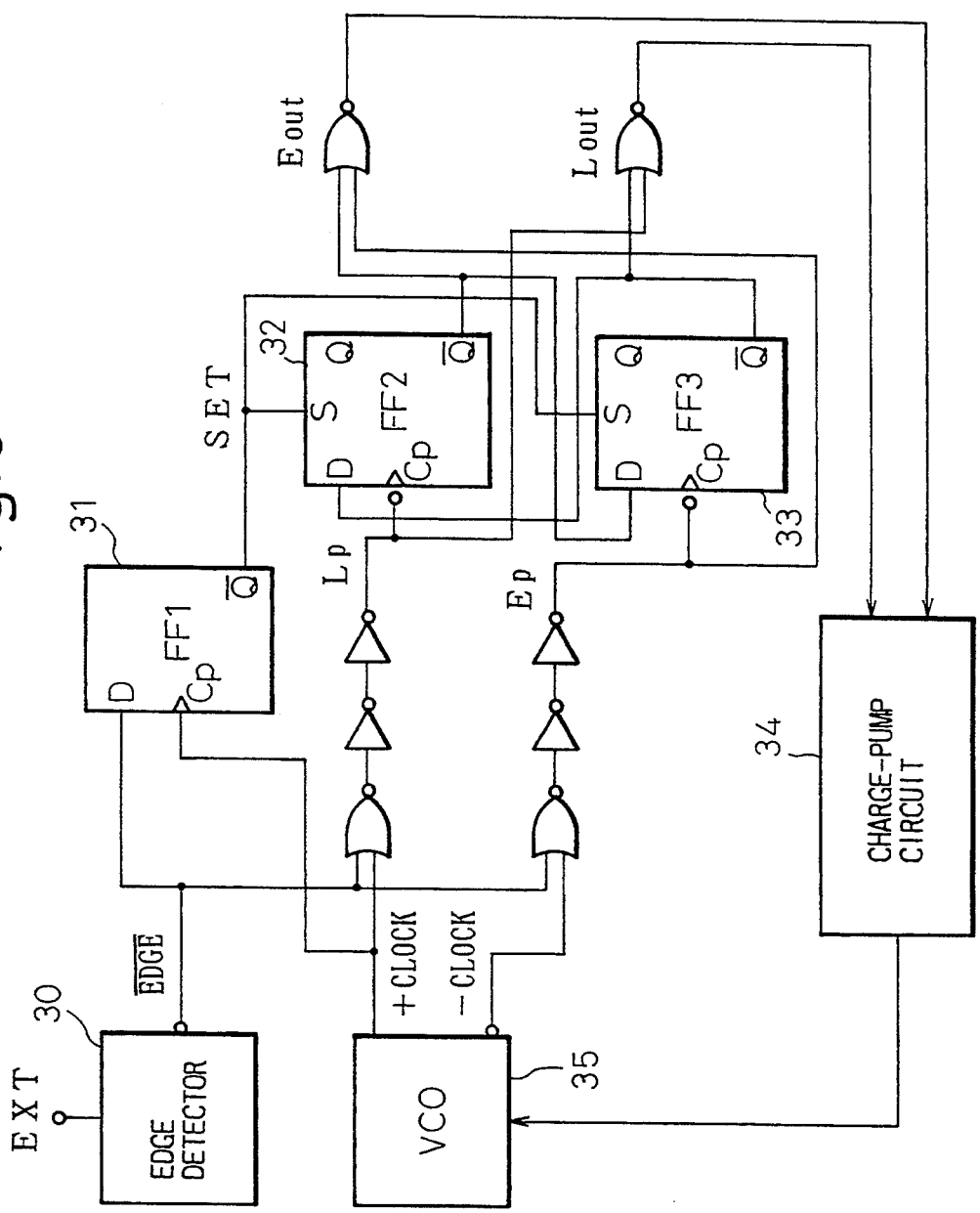
FIG. 9 is a block circuit diagram showing a construction of a PLL circuit using the charge-pump circuit according to the present invention.

FIG. 9 is a block circuit diagram showing the construction of a PLL circuit using the charge-pump circuit according to the present invention. In FIG. 9, reference numeral 30 denotes an edge detector, 31, 32, and 33 denote a first, a second, and a third flip-flop respectively, 34 denotes the charge-pump circuit of the present invention, and 35 denotes a VCO. The first, the second, and the third flip-flops are shown as FF1, FF2, and FF3 in FIG. 9.

An external signal EXT is an external transmission data signal, and its reference cycle is To. An edge pulse $\overline{\text{EDGE}}$ is produced from the external signal EXT by the edge detector 30. Moreover, the VCO 35, whose frequency is controlled by the charge-pump circuit 34, produces internal clocks (+CLOCK and −CLOCK) having a mutually inverted phase. These internal clocks (+CLOCK and −CLOCK) having a mutually inverted phase are input to NOR circuits respectively; the logical sum of the internal clocks and the edge pulse $\overline{\text{EDGE}}$ is calculated respectively; and phase informations signals Lp and Ep for the rise of the internal clock +CLOCK and for the center of the edge pulse $\overline{\text{EDGE}}$ are produced. These phase information signals Lp and Ep are input to the second and the third flip-flops 32 and 33 as clock signals.

If a rise of the internal clock +CLOCK occurs within the active time of the edge pulse $\overline{\text{EDGE}}$: an inverted output $\overline{Q}$ of the first flip-flop 31 becomes high; the second and the third flip-flops 32 and 33 are set; each of the inverted outputs $\overline{Q}$ of the second and the third flip-flops 32 and 33 become low; and the phase information signals Lp and Ep are transmitted to the NOR circuit to become the signals Eout and Lout.

If a rise of the internal clock +CLOCK does not occur within the active time of edge pulse $\overline{\text{EDGE}}$: a set signal becomes low; the second or the third flip-flop 32 or 33 is activated by the first pulse which might be the phase information Lp or Ep; one of the inverted outputs $\overline{Q}$ of the second or the third flip-flop 32 or 33 becomes high; and the transmission of the signal for producing a corresponding signal Eout or Lout to the NOR circuit is inhibited.

The signals Eout and Lout produced in this way are input to the charge-pump circuit as shown in FIG. 8 as the first and the second drive signals CC and DD respectively; a phase difference between the signals CC and DD causes a change to appear on the capacitor C1 in the charge-pump circuit. As a result, the output voltage CHO of the charge-pump circuit changes, and this change is fedback to the VCO.

Figure 10:
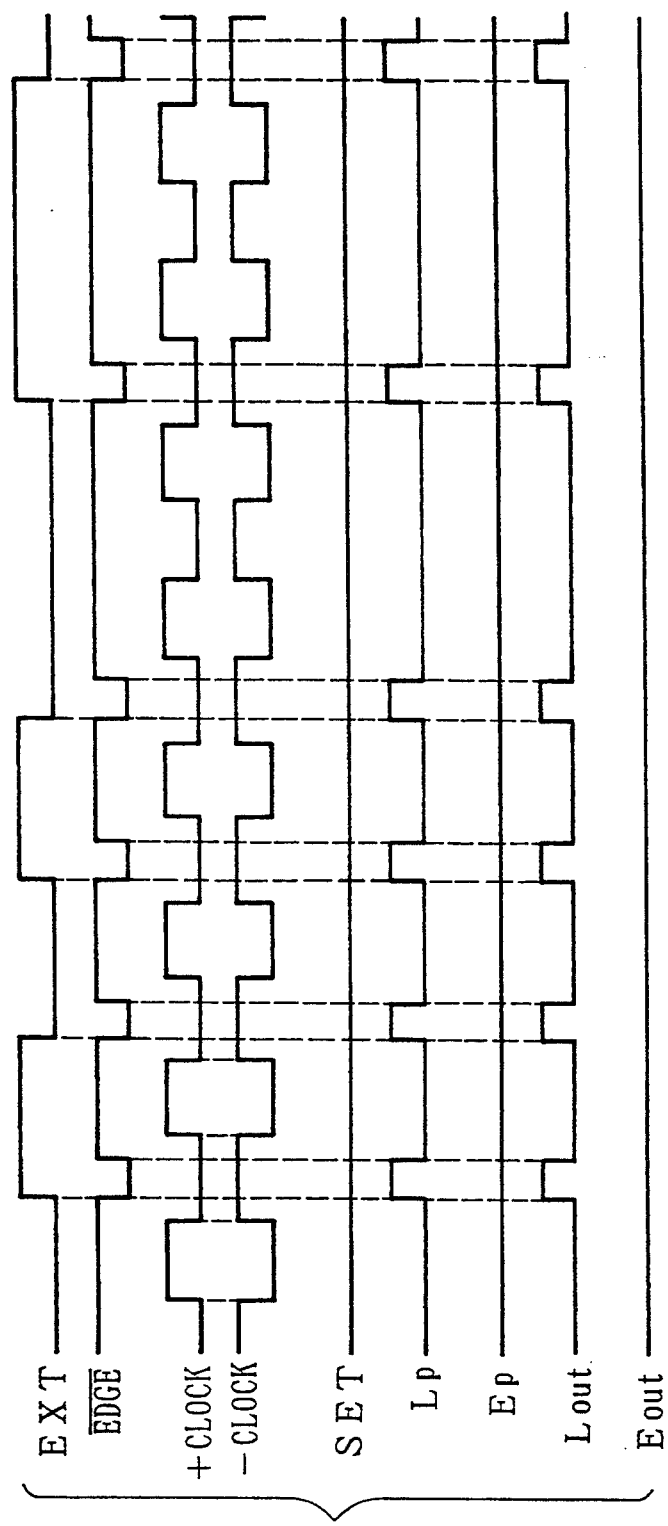
FIG. 10 shows waveform diagrams at particular points in the PLL circuit in FIG. 9 when the rise of the positive clock pulse lags the center of an edge pulse by a large amount.

FIG. 10 shows waveform diagrams of the external signal EXT, the edge pulse $\overline{\text{EDGE}}$, the internal clocks +CLOCK and −CLOCK, the set signal SET, the phase information signals Lp and Ep, and a change in the output signals Eout and Lout from the NOR circuit, when the rise of the internal clock pulse +CLOCK lags the center of the edge pulse $\overline{\text{EDGE}}$.

Since the internal clock +CLOCK signal exists after the edge pulse $\overline{\text{EDGE}}$, the set signal SET becomes low, a pulse is generated as the phase information signal Lp, and no pulse is generated as the phase information signal Ep. Accordingly, an initial low level at the inverted output $\overline{Q}$ of the flip-flop 33 is read as data from the flip-flop 32 at the fall of the phase information signal Lp, and then the inverted output $\overline{Q}$ of the flip-flop 32 becomes high and the output signal Eout becomes low. As a result: the output signal Lout is only input to the charge-pump circuit as the second drive signal DD; the output signal Eout remains low; the information of the phase delay is stored in the capacitor C1; and the output voltage CHO is increased. The frequency of the VCO is increased by the increment of the output voltage CHO, and is fedback so as to advance the rise of the internal clock +CLOCK to the external signal EXT.

Figure 11:
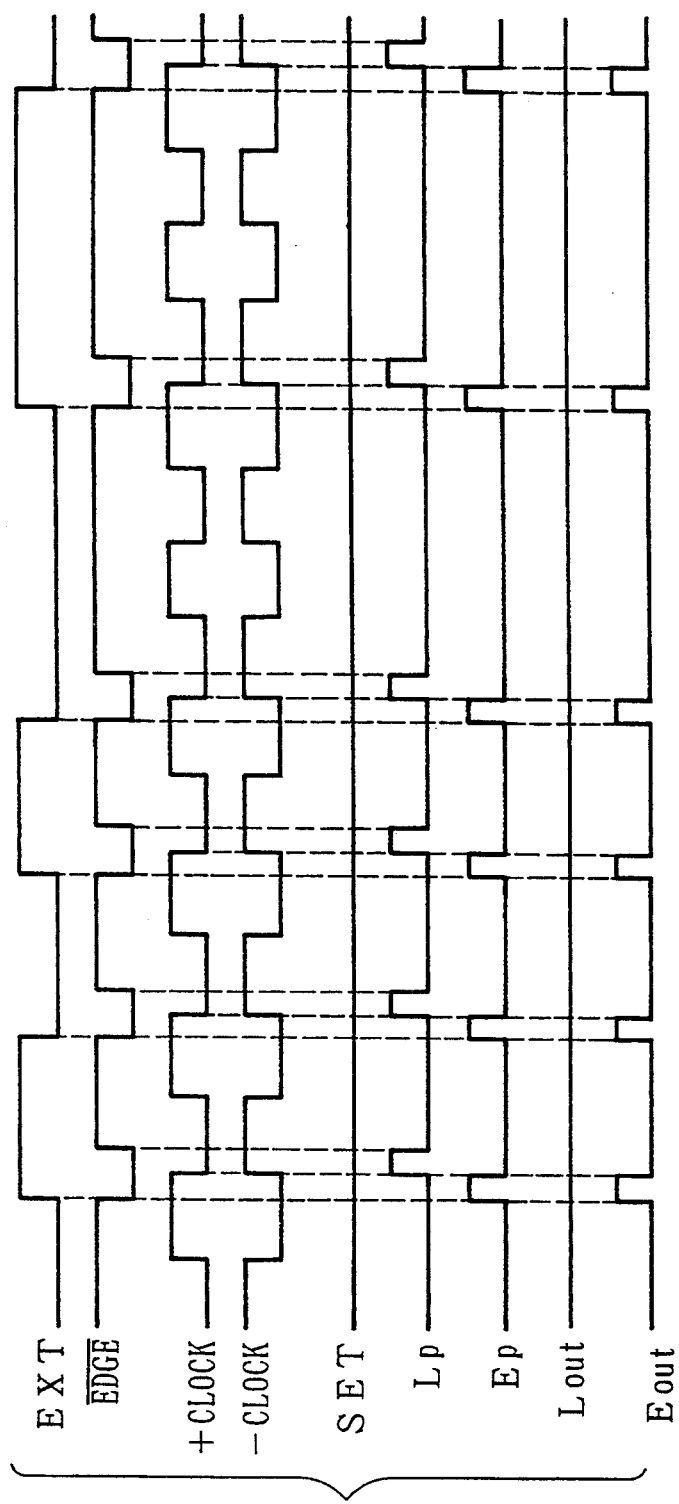
FIG. 11 shows waveform diagrams at particular points in the PLL circuit in FIG. 9 when the rise of the positive clock pulse preceeds to the center of an edge pulse by a large amount.

FIG. 11 shows the first case of waveform diagrams of the external signal EXT, the edge pulse $\overline{\text{EDGE}}$, the internal clocks +CLOCK and −CLOCK, the set signal SET, the phase informations signals Lp and Ep, and a change of the output signals Eout and Lout from the NOR circuit, when the rise of the internal clock pulse +CLOCK is advanced with respect to the center of the edge pulse $\overline{\text{EDGE}}$.

Since the rise of the internal clock +CLOCK starts before the edge pulse $\overline{\text{EDGE}}$, the set signal SET becomes low, and pulses are generated as phase information signals Lp and Ep. Since the phase information signal Ep is generated earlier than the phase information signal Lp, a low initial value at the inverted output $\overline{Q}$ of the flip-flop 32 is read as a data by the flip-flop 33 at the fall of the phase information signal Ep, and then the inverted output $\overline{Q}$ of the flip-flop 33 becomes high and the output signal Lout becomes low even though the pulses of the phase information Lp are continuous. As a result, opposite to the case of FIG. 10, the phase advance information changes the charge on the capacitor C1, and the output voltage CHO is decreased. As explained before, the frequency of the VCO is designed to be increased by the increment of the output voltage CHO, and is fedback so as to delay the rise of the internal clock +CLOCK with respect to the external signal EXT.

Figure 12:
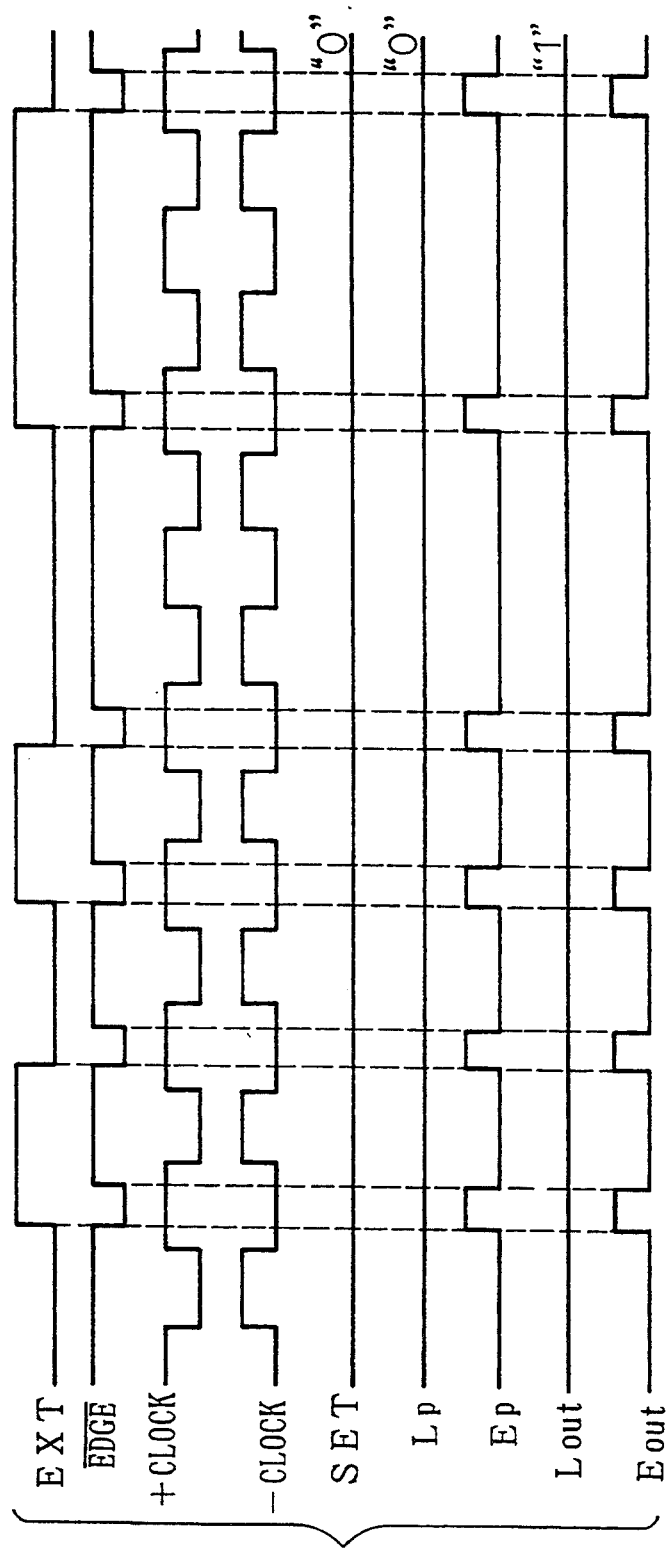
FIG. 12 shows other waveform diagrams at particular points in the PLL circuit in FIG. 9, when the rise of the positive clock pulse preceeds the center of an edge pulse by a large amount.

FIG. 12 shows the second case of waveform diagrams of the external signal EXT, the edge pulse $\overline{\text{EDGE}}$, the internal clocks +CLOCK and −CLOCK, the set signal SET, the phase informations signals Lp and Ep, and a change of the output signals Eout and Lout from the NOR circuit, when the rise of the internal clock pulse +CLOCK is advanced with respect to the center of the edge pulse $\overline{\text{EDGE}}$.

In this second case, it is easily understood that the rise of the internal clock +CLOCK with respect to the external signal EXT is delayed, opposite to the case in FIG. 10.

Figure 13:
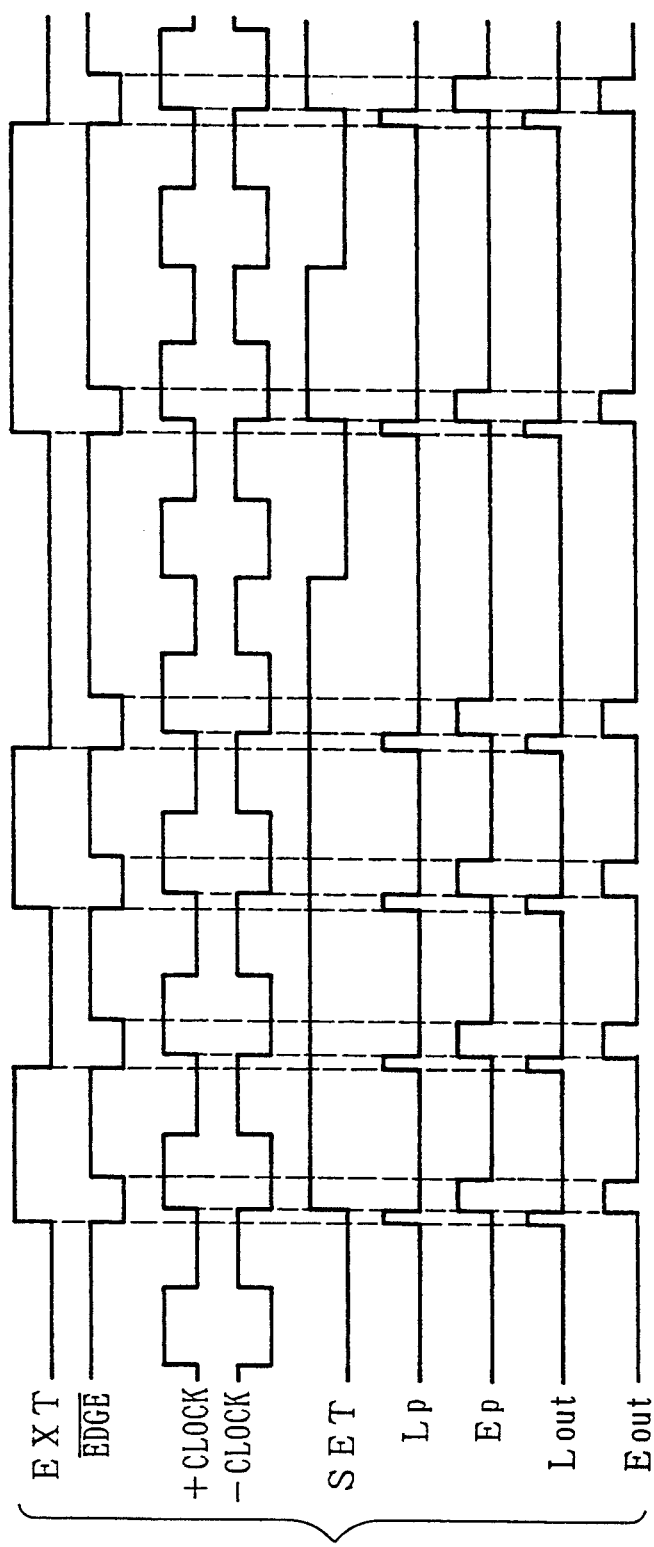
FIG. 13 shows other waveform diagrams at particular points in the PLL circuit in FIG. 9 when the rise of the positive clock pulse preceeds the center of an edge pulse within the active time of the edge pulse.

FIG. 13 shows waveform diagrams of the external signal EXT, the edge pulse $\overline{\text{EDGE}}$, the internal clocks +CLOCK and −CLOCK, the set signal SET, the phase information signals Lp and Ep, and a change of the output signals Eout and Lout from the NOR circuit, when the rise of the internal clock pulse +CLOCK is within the edge pulse $\overline{\text{EDGE}}$.

Since the rise of the internal clock +CLOCK occurs within the edge pulse $\overline{\text{EDGE}}$, the set signal SET becomes high, the flip-flops 32 and 33 are set, and the inverted outputs $\overline{Q}$ of the flip-flops 32 and 33 become low. Accordingly, the pulses of the phase information signals Ep and Lp are both inverted and output as the output signals Eout and Lout. As a result, a charge in proportion to the difference of the pulse width between the phase information Ep and Lp is stored on the capacitor C1; however, the pulse width of the phase information signal Lp is wider than that of the phase information signal Ep and the output voltage CHO is gradually decreased. So, the feedback control is carried out so as to gradually synchronize the rise of the internal clock +CLOCK to the external signal EXT.

Figure 14:
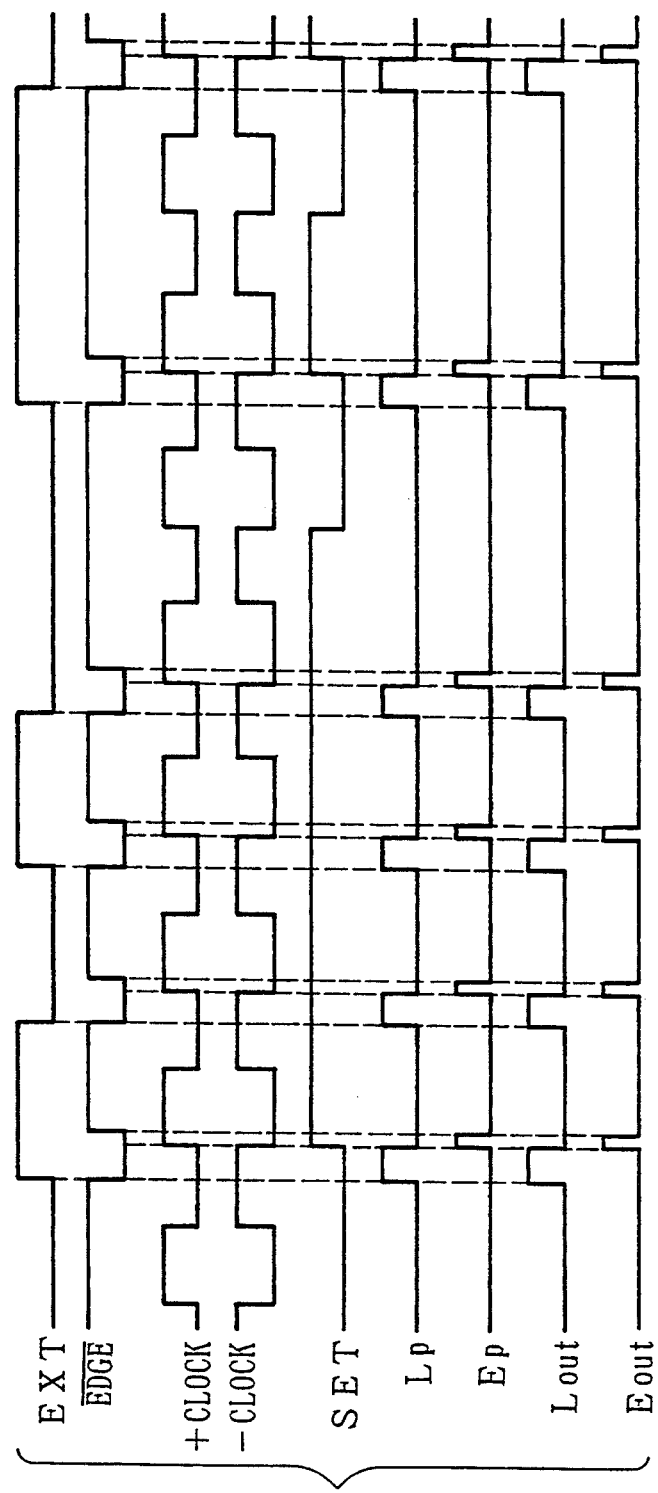
FIG. 14 shows another waveform diagrams at particular points in the PLL circuit in FIG. 9 when the rise of the positive clock pulse lags the center of an edge pulse within the active time of the edge pulse.

FIG. 14 shows waveform diagrams of the external signal EXT, the edge pulse $\overline{\text{EDGE}}$, the internal clocks +CLOCK and −CLOCK, the set signal SET, the phase information signals Lp and Ep, and a change of the output signals Eout and Lout from the NOR circuit, when the rise of the internal clock pulse +CLOCK lags to within the width of the edge pulse $\overline{\text{EDGE}}$.

Since the rise of the internal clock +CLOCK exists within the edge pulse $\overline{\text{EDGE}}$ as is the case in FIG. 13, the set signal SET goes high and the flip-flops 32 and 33 are set. Accordingly, the inverted output $\overline{Q}$ of the flip-flops 32 and 33 become low. The pulses of the phase information signals Ep and Lp are both inverted and output as the output signals Eout and Lout.

As a result, since the pulse width of the phase information Ep is wider than that of the phase information Lp, the output voltage CHO is gradually increased. Thus, feedback control is carried out so as to gradually synchronize the rise of the internal clock +CLOCK to the external signal EXT.

As explained above, the phase error signal is stored in the capacitor of the charge-pump circuit by the output signal Eout and Lout of the NOR circuit, thereby changing the frequency of the VCO, and feedback control is carried out to decrease the phase error.

What is claimed is:

1. A charge-pump circuit which converts a phase difference between first and second drive signals into a voltage comprising:
   a first feeder circuit including bipolar transistors, an input for receiving the first drive signal and an output terminal, the first feeder circuit producing an output current at the output terminal when the first drive signal is received;
   a second feeder circuit including bipolar transistors, an input for receiving the second drive signal and an output terminal, the second feeder circuit producing an output current at the output terminal when the second drive signal is received;
   a capacitor circuit comprising a first capacitor having a first end and a second end, a second capacitor, and a third capacitor, the output terminal of the first feeder circuit being connected to the first end of the first capacitor and the output terminal of the second feeder circuit being connected to the second end of the first capacitor, the second capacitor being connected between the second end of the first capacitor and a reference electrical potential, and the third capacitor being connected between the first end of the first capacitor and the reference electrical potential, the respective output currents of the first and second feeder circuits charging the capacitor circuit and producing a voltage across the first capacitor; and
   a main differential amplifying circuit, including bipolar transistors, which receives the voltage produced across the first capacitor and amplifies the received voltage to a selected, amplified voltage and then outputs the amplified voltage.

2. A charge-pump circuit as set forth in claim 1, wherein:
   a first resistor is inserted between the first end of the first capacitor and the output terminal of the first feeder circuit and a second resistor is inserted between the second end of the first capacitor and the output terminal of the second feeder circuit, the first capacitor, the first resistor and the third capacitor thereby defining a first integration circuit and the first capacitor, the second resistor and the second capacitor thereby defining a second integration circuit.

3. A charge-pump circuit as set forth in claim 2, wherein:
   the first drive signal has a first phase and the second drive signal has a second phase which is different from the first phase;
   the first drive signal and the second drive signal do not become high at the same time; and
   a signal indicating the phase difference between the respective first and second phases of the first and second drive signals is stored in the first capacitor as a charge.

4. A charge pump circuit as set forth in claim 3, wherein:
   the first feeder circuit comprises:
      a differential amplifying circuit which includes a first transistor and a second transistor and receives the first drive signal as an input, the first and second transistors each having a respective collector,
      a third transistor having an emitter and connected to the collector of the first transistor,
      a fourth transistor, having an emitter, and a fifth transistor, the fourth transistor and the fifth transistor being connected to the collector of the second transistor, and
      a current mirror circuit connected to the emitters of the third and fourth transistors, respectively;
   the second feeder circuit comprises:
      a differential amplifying circuit which includes a first transistor and a second transistor and receives the second drive signal as an input, the first and second transistors each having a respective collector,
      a third transistor having an emitter and connected to the collector of the first transistor,
      a fourth transistor, having an emitter, and a fifth transistor, the fourth transistor and the fifth transistor being connected to the collector of the second transistor, and
      a current mirror circuit connected to the emitters of the third and fourth transistors, respectively;
   the capacitor circuit is charged when the output of one of the first feeder circuit and the second feeder circuit becomes a high-level;
   the main differential amplifying circuit comprises:
      an input part including a first transistor and a second transistor which form an emitter-follower, the first and second transistors each having a respective base,
      a main differential first resistor and a main differential second resistor having the same resistance, respectively, the base of the first transistor being connected to the first end of the first capacitor through the main differential first resistor, the base of the second transistor being connected to the second end of the first capacitor through the main differential second resistor,
      a differential amplifying part which includes a differential amplifier having a transistor connected to the input part, the differential amplifying part receiving a voltage which exists across the first capacitor and outputting the received voltage, and
      a voltage output part which amplifies the voltage output by the differential amplifying part and then outputs the amplified voltage; and
   the same amount of leak current flows out of the second and third capacitors when the first capacitor is not being charged.

5. A phase locked loop circuit comprising a charge-pump circuit as set forth in claim 4 wherein the charge-pump circuit produces an output, the phase locked loop circuit further comprising:
   a phase comparator which receives first and second input signals and produces a corresponding output signal indicating a phase difference between the first and second input signals, the phase comparator and the charge-pump circuit being coupled together so that the charge-pump circuit receives the output signal of the phase comparator;

a voltage controlled oscillator coupled to the charge-pump circuit to receive the output of the charge-pump circuit and produce a corresponding output signal in response thereto, the output signal of the voltage controlled oscillator being input to the phase comparator as the second input signal thereto; and an output circuit which receives the first input signal and is coupled to the voltage controlled oscillator so as to also receive the output signal of the voltage controlled oscillator and which outputs a data signal in response to the first input signal and the output signal of the voltage controlled oscillator; and the output of the charge-pump circuit is supplied no and controls the frequency of the voltage controlled oscillator.

* * * * *

UNITED STATES PATENT AND TRADEMARK OFFICE
CERTIFICATE OF CORRECTION

PATENT NO. : 5,382,923
DATED : January 17, 1995
INVENTOR(S) : Toshizi SHIMADA, et al.

It is certified that error appears in the above-indentified patent and that said Letters Patent is hereby corrected as shown below:

Title Page, Item [57], line 18, delete "an" and insert therefor --a--.
Col. 8, lines 46, 48, 57 and 59, delete "≠" and insert therefor --≑--.
Col. 9, line 5, delete "transistor" and insert therefor --transistors--.
Col. 12, line 28, delete "clock" and insert therefor --+clock--.

Signed and Sealed this

Eleventh Day of July, 1995

Attest:

BRUCE LEHMAN

*Attesting Officer*        *Commissioner of Patents and Trademarks*